Aug. 20, 1968 M. K. AVEDISSIAN ET AL 3,397,451

SEQUENTIAL WIRE AND ARTICLE-BONDING METHODS

Filed April 6, 1966

INVENTORS
M.K.AVEDISSIAN
J.S.MANOWCZAK

BY J. L. Landis
ATTORNEY

United States Patent Office 3,397,451
Patented Aug. 20, 1968

3,397,451
SEQUENTIAL WIRE AND ARTICLE-BONDING METHODS

Michael K. Avedissian, Mohnton, and Joseph S. Manowczak, Reading, Pa., assignors to Western Electric Company, Incorporated, New York, N.Y., a corporation of New York
Filed Apr. 6, 1966, Ser. No. 540,736
6 Claims. (Cl. 29—589)

Figure 1:
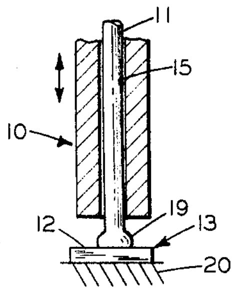

This invention relates generally to methods of sequentially bonding a wire to a first article and the first article to a second, and more particularly to bonding of a lead wire to a semiconductive wafer and thereafter bonding the wafer to a header. Accordingly, the general objects of the invention are to provide new and improved methods of such character.

In the manufacture of semiconductor devices, such as diodes and transistors, it is necessary that one or more semiconductive wafers be bonded on a header. Also, conductive leads in the form of line wires must be bonded to the wafers and to corresponding terminal posts located on the header supporting the wafers. In the past, the wafers have been thermocompressively bonded to other wafers or to the header by utilizing a needle with a vacuum pickup to position and press the wafer against the header. In forming a bond, the tip of the needle applies pressure to the surface of the wafer, and because of limited contact area, which is essentially point contact, a high localized stress is set up in the wafer which has a detrimental effect on the device. The bonding of the conductive leads between the wafers and the corresponding terminal posts requires a different type of needle than the wafer bonding needle. This requirement results in wasted motion and loss of time to allow for a needle change, or for the device to be moved to a different bonding apparatus. It is, therefore, desirable to use one needle for all pick-up and bonding operations.

Accordingly, another object of the invention is to provide new and improved methods utilizing one bonding needle for both wire and wafer-bonding operations.

A further object of the invention is to provide new and improved methods of fabricating semiconductor devices to reduce stress forces set up in semiconductive wafers during the bonding operations.

Another object is to provide new and improved methods of sequentially bonding a lead wire to a first semiconductive wafer, bonding the first wafer to a second wafer, bonding the second wafer to a metal header, and then bonding the wire to a terminal post on the header.

With the foregoing and other objects in view, one method illustrating certain features of the invention includes the step of bonding an end of a wire to one surface of a first article with a bonding needle, such as a conventional thermocompression wire bonding needle. The wire bond must be strong enough that the wire can thereafter support the weight of the first article. After this, the needle is used as a pick-up tool to transport the first article to a position facing the second and to place the first article against the second in a desired bonding position. Then, the first article is bonded to the second.

In the manufacture of semiconductive devices, a lead wire is first bonded to a wafer, after which the wafer is either bonded to a header or to a second wafer which in turn is bonded to the header. In each case, the initial wire-wafer bond serves to permit transporting of the wafers by the bonding tool and positioning of the wafers for the wafer-bonding operations. Preferably, the needle is also used to bond the wire to one or more terminal posts on the header to connect the wafer or wafers to the posts. Preferably, the bonding needle is raised after bonding of the wire to each post to break the wire adjacent to the post, and the broken end of the wire is then passed over a flame which forms a ball on the end of the wire preparatory to the next bonding cycle.

Figure 6:
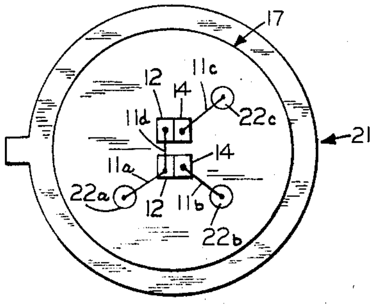

Other objects, advantages and features of the invention will be apparent from the following detailed description of a specific embodiment thereof, when read in conjunction with the appended drawings in which:

FIGS. 1–5 are elevational views, partly in longitudinal cross-section, disclosing the various steps of a bonding sequence in accordance with the invention; and FIG. 6 is a plan view of a semiconductive device having bonded wafers and leads formed in accordance with the steps depicted in FIGS. 1–5.

Figure 2:
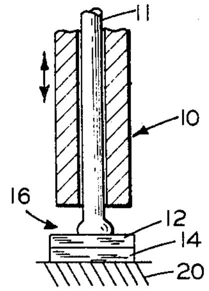
Figure 3:
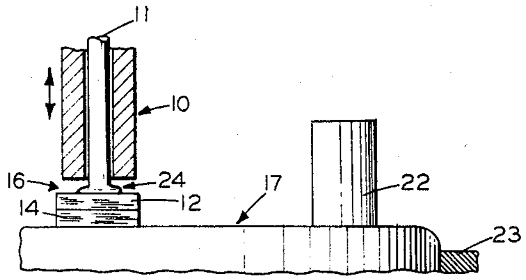
Figure 4:
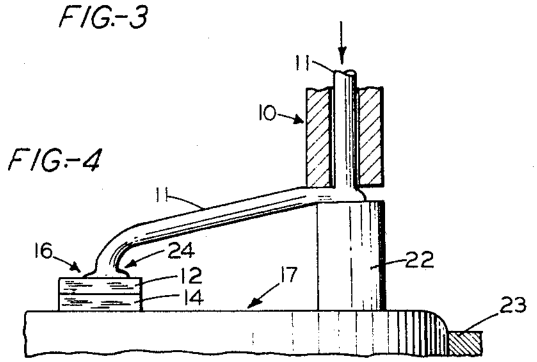
Figure 5:
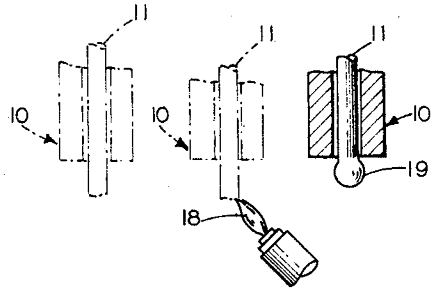

Referring now to the drawings, and particularly to FIGS. 1–5, there is shown a heated thermocompression bonding needle 10, of generally conventional type, for bonding a conductive lead wire 11 to a heated semiconductive wafer 12 to form a wire-wafer assembly 13. The wire-wafer assembly 13 is then moved by the needle 10 to a second heated semiconductive wafer 14 (FIG. 2) where the first wafer 12 is bonded to the second wafer 14 to form a wire-wafer-wafer assembly 16. The assembly 16 is moved by the needle 10 to a semiconductor header 17 (FIG. 3) where the assembly 16 is thermocompressively bonded to the header. The bonding needle 10 is raised and moved to a terminal post 22 of the header and thermocompressively bonded thereto (FIG. 4). The needle 10 is then moved to its normal retracted position, which breaks the wire 11. Next, the broken end of the wire is passed by a flame 18 (FIG. 5), which forms a ball 19 on the end of the wire 11 preparatory for the next bonding cycle. It should be noted that the invention is not limited to the forming of thermocompression bonds only. For example, mechanical vibrations at ultrasonic frequencies may also be utilized as a bonding aid in place of the heat employed in the instant embodiment. Also, eutectic bonding may be utilized in forming the bonds with the heat controller apparatus disclosed in a co-pending application of M. K. Avedissian, Ser. No. 328,989, filed Dec. 9, 1963, now U.S. Patent No. 3,290,479, issued Dec. 6, 1966.

In the specific embodiment illustrated, as seen in FIG. 6, the assembled semiconductive device 21 includes the header 17 having two sets of two semiconductive wafers 12 and 14 affixed to its top surface. Four conductive wires are bonded to the wafers, a wire 11A between the first wafer 12 and a first terminal post 22A, a wire 11B between the second wafer 14 and the terminal post 22B, a wire 11C between the second wafer 14 and the terminal post 22C, and a wire 11D between the two semiconductor wafers 12—12. This specific product illustrated is a full-wave rectifier, including two diode pairs such as 12–14 of semiconductive material such as germanium or silicon plated with a contact metal such as gold. The wires 11A–11D serve as conductive leads and are composed of material such as gold.

As illustrated in FIG. 1, the wire 11 passes through the tube-like bonding needle 10. The needle 10 has an opening 15 with a diameter slightly larger than the diameter of the wire 11 as is conventional in wire-bonding operations. The wafer 12 is mounted on a flat, preferably heated surface 20 preparatory to the bonding operation. The needle 10 is positioned to bring the ball 19 into contact with the wafer 12, where heat is utilized to bond the ball 19 to a portion of the upper surface of the wafer 12 forming the wire-wafer assembly 13. In the process, the ball 19 is somewhat flattened as shown in FIG. 2, the main object of this first wire bond being to form a bond of sufficient strength so that the wire can support the weight of the wafer. A minimum of pressure is applied to reduce the possibility of setting up localized stresses in the wafer.

A second wafer 14 (FIG. 2) is mounted on the flat, preferably heated surface 20, or a different heated support, and the needle 10 manipulated to position the wire-wafer assembly 13 over the second wafer 14, where heat is applied to form the wire-wafer-wafer assembly 16. In this process a minimum of pressure is again applied in bonding the first wafer to the second wafer to reduce localized stresses and provide a bond of sufficient strength to support both wafers, so that the assembly may be moved.

The wire-wafer-wafer assembly 16 is then lifted, and is moved to the position shown in FIG. 3, where the wafer 14 is positioned over and can be bonded to the header 17, which is mounted in a heated fixture 23 to bring the header to the desired wafer-bonding temperature. In this bonding operation, the bonding needle 10 applies pressure to the ball 19 simultaneously with heat to form a thermocompression bond 24, while flattening out the ball 19 to form a flat concentric bond. This operation is the only operation in the bonding of the wire-wafer-wafer-header assembly that any significant pressure is applied, and the flattening of the ball 19 provides a uniform distribution of pressure to diminish localized stresses.

Referring to FIG. 4, the bonding needle 10 is then raised and moved to a position opposite to the terminal post 22, while paying out the wire 11, as is customary in lead-bonding processes of this class. The wire 11 is then thermocompressively bonded to the terminal 22. As the bonding needle 10 is raised and moved toward its normal retracted position, a braking element (not shown) applies a restraining force on the wire 11 to cause it to break adjacent the last bond. The broken end of the wire 11 is then moved over the flame 18 (FIG. 5) which forms the ball 19 on the end of the wire 11 preparatory to the next bonding operation. Following the above sequence of steps, the wires 11A–11D are bonded between the two sets of wafers 12–14 and the terminal posts 22A–22C to complete the formation of the semiconductive devices 21.

While this invention has been described in such a manner that the first bond was made between the wire and a wafer and the second bond was made between two wafers, the method can equally well be used to bond a single wafer directly to a header in the second bonding operation. Also, a bonding needle having a recessed point may be used with the recessed area used to shape the ball over a determined area when pressure is applied to the ball.

Inasmuch as various forms of the thermocompression bonding equipment suitable for practicing the invention are now well-known in the art, the bonding equipment is not shown herein. One suitable assembly is described in R. P. Clagett Patents 3,087,239 and 3,128,648, herein incorporated by reference, particularly for further description of the thermocompression bonding techniques and apparatus.

It is to be understood that the above-described embodiment is merely illustrative of the principles of the invention, and that other embodiments may be devised by persons skilled in the art which embody these principles and fall within the spirit and scope of the invention.

What is claimed is:

1. The method of sequentially bonding a wire to a first article and the first article to a second, which comprises:

bonding an end of the wire to one surface of the first article with a bonding needle having an opening through which the end of the wire protrudes, so as to form a wire bond of sufficient strength that the wire can support the weight of the first article;

moving the needle to transport the first article to a position facing the second and to place the first article against the second in the desired bonding position; and then bonding the first article to the second.

2. The method as recited in claim 1, wherein:

the end of the wire is heated prior to the wire-bonding step to form a ball at the end of the wire; and the wire-bonding step is performed by heating the bonding needle and the first article and by pressing the ball against the first article with the needle.

3. The method as recited in claim 1, wherein:

the initial wire-bonding step is performed with as little pressure applied to the wire and first article as is consistent with forming a wire bond of the required strength to support the first article;

the wire end is thermocompressively bonded to the first article after the step of bonding the two articles together, the bonding needle being a thermocompression bonding needle; and the wire is thereafter advanced through the needle, is bonded thermocompressively to another element spaced from the first article, and is then broken to leave a length of the wire connecting the first article with the other element.

4. In the manufacture of electrical devices of a type wherein at least one metallized wafer is bonded to a header and at least one metallic lead wire is bonded between a portion of the wafer and a terminal post on the header, an improved method of making the wire and wafer bonds and of assembling the parts comprising:

(a) thermally bonding an end of the wire to one surface of a wafer with a heated bonding needle having an opening through which the end of the wire protrudes, so as to form a first wire bond of sufficient strength that the wire can support the weight of the wafer;

(b) moving the needle to transport the wafer to a position facing the header and to place the wafer against the header in the desired bonding position;

(c) bonding the wafer to the header;

(d) moving the needle to a position opposite to the post to advance a length of wire through the needle;

(e) thermally bonding a portion of the wire to the post with the needle to form a second wire bond; and then (f) breaking the wire adjacent to the post so as to leave the length of wire connecting the wafer to the post.

5. The method as recited in claim 4, wherein:

after step (a), the wire-wafer assembly is moved and the wafer is bonded to a second wafer to form a wafer-wafer bond of sufficient strength that the wire can support both wafers;

in step (c), the second wafer is bonded to the header; and after step (f), another length of the wire is bonded between a portion of the second wafer and a second terminal post on the header.

6. The method of bonding a metallic lead wire to a first semiconductive wafer, bonding the first wafer to a second wafer, bonding the second wafer to a metal header, and bonding the wire to a terminal post on the header, which comprises:

feeding a length of the wire through a bonding needle until an end of the wire protrudes from the needle;

heating and melting the end of the wire until surface tension effects form a ball-like end of the metal at the end of the wire;

positioning the first wafer on a flat, heated, surface;

bringing the ball-like end of the wire into contact with the wafer;

heating the ball-like end of the wire and the wafer and pressing the ball-like end against the surface of the wafer to form a bond between the wire and the wafer of sufficient strength to support the wafer;

positioning the second wafer on a flat, heated surface;

moving the needle to bring the bonded wire-wafer assembly into contact with the second wafer and to form a bond between the first and second wafers of sufficient strength that the wire can support both wafers;

moving the needle to bring the wire-wafer-wafer assembly into contact with the header;

heating the wire-wafer-wafer assembly and the header and simultaneously compressing the assembly against the header until the ball-like end is flattened and the contacting heated surfaces form a strong mechanical and electrical bond between the assembly surfaces as well as the second wafer and the header;

moving the needle while feeding a length of wire therethrough to a position opposite to the post;

moving the needle to bond a portion of the wire to the post and form a bond between the wire and post; and moving the needle away from the post to break the wire adjacent to the post.

References Cited

UNITED STATES PATENTS

| | | | |
|---|---|---|---|
| 3,087,239 | 4/1963 | Clagett | 29—471.1 |
| 3,125,803 | 3/1964 | Rich. | |
| 3,125,906 | 3/1964 | Johnson | 228—4 |
| 3,128,648 | 4/1964 | Clagett | 29—497.5 X |
| 3,165,818 | 1/1965 | Soffa et al. | 219—103 X |
| 3,216,640 | 11/1965 | Szasz | 228—4 X |
| 3,313,464 | 4/1967 | Avedissian | 228—3 |

JOHN F. CAMPBELL, *Primary Examiner.*

J. CLINE, *Assistant Examiner.*